United States Patent
Hshieh et al.

(10) Patent No.: US 6,822,288 B2
(45) Date of Patent: Nov. 23, 2004

(54) TRENCH MOSFET DEVICE WITH POLYCRYSTALLINE SILICON SOURCE CONTACT STRUCTURE

(75) Inventors: Fwu-Iuan Hshieh, Saratoga, CA (US); Koon Chong So, Fremont, CA (US); John E. Amato, Tracy, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/010,484

(22) Filed: Nov. 20, 2001

(65) Prior Publication Data

US 2003/0107080 A1 Jun. 12, 2003

(51) Int. Cl.[7] ............................................... H01L 29/76
(52) U.S. Cl. ..................... 257/330; 257/328; 257/329; 257/331; 257/332; 257/341; 257/381
(58) Field of Search ................................. 257/330, 331, 257/332, 381, 396, 397, 328, 329, 341, 401, 327, 334, 338, 339; 438/270, 564, 589, 596

(56) References Cited

U.S. PATENT DOCUMENTS

| | | | |
|---|---|---|---|
| 5,072,266 A | 12/1991 | Bulucea et al. | 257/330 |
| 5,541,425 A | 7/1996 | Nishihara | 257/139 |
| 5,684,319 A | 11/1997 | Hebert | 257/336 |
| 5,731,236 A | 3/1998 | Chou et al. | 438/253 |
| 5,866,931 A | 2/1999 | Bulucea et al. | 257/331 |
| 5,942,785 A | 8/1999 | Chen et al. | 257/382 |
| 6,031,265 A | 2/2000 | Hshieh | 257/334 |
| 6,251,730 B1 * | 6/2001 | Luo | 438/270 |
| 6,472,678 B1 * | 10/2002 | Hshieh et al. | 257/3 |

* cited by examiner

Primary Examiner—Minhloan Tran
Assistant Examiner—Tan Tran
(74) Attorney, Agent, or Firm—Mayer Fortkort & Williams, PC; David B. Bonham, Esq.; Karin L. Williams, Esq.

(57) ABSTRACT

A trench MOSFET transistor device and a method of making the same. The device comprises: (a) a silicon substrate of first conductivity type; (b) a silicon epitaxial layer of first conductivity type over the substrate, the epitaxial layer having a lower majority carrier concentration than the substrate; (c) a trench extending into the epitaxial layer from an upper surface of the epitaxial layer; (d) an insulating layer lining at least a portion of the trench; (e) a conductive region within the trench adjacent the insulating layer; (f) a body region of second conductivity type provided within an upper portion of the epitaxial layer and adjacent the trench; (g) a source region of first conductivity type provided within an upper portion of the body region and adjacent the trench; (h) an upper region of second conductivity type within an upper portion of the body region and adjacent the source region, the upper region having a higher majority carrier concentration than the body region; and (i) a source contact region disposed on the epitaxial layer upper surface, wherein the source contact region comprises a doped polycrystalline silicon contact region in electrical contact with the source region as well as an adjacent metal contact region in electrical contact with the source region and with the upper region.

16 Claims, 9 Drawing Sheets

US 6,822,288 B2

TRENCH MOSFET DEVICE WITH POLYCRYSTALLINE SILICON SOURCE CONTACT STRUCTURE

BACKGROUND OF THE INVENTION

The present invention relates to trench MOSFET devices, and more particularly to trench MOSFET devices having low source contact resistance.

A trench MOSFET (metal-oxide-semiconductor field-effect transistor) is a transistor in which the channel is formed vertically and the gate is formed in a trench extending between the source and drain. The trench, which is lined with a thin insulator layer such as an oxide layer and filled with a conductor such as polycrystalline silicon (also known as polysilicon), allows less constricted current flow and thereby provides lower values of specific on-resistance. Examples of trench MOSFET transistors are disclosed, for example, in U.S. Pat. Nos. 5,072,266, 5,541,425, 5,866,931 and 6,031,265, the disclosures of which are hereby incorporated by reference.

As a specific example, FIG. 1 illustrates half of a hexagonally shaped trench MOSFET structure 21, which is disclosed in U.S. Pat. No. 5,072,266. The structure includes an n+ substrate 23, upon which is grown a lightly doped n epitaxial layer 25 of a predetermined depth $d_{epi}$. Within the epitaxial layer 25, p body region 27 (p, p+) is provided. In the design shown, the p body region 27 is substantially planar (except in a central region) and typically lays a distance $d_{min}$ below the top surface of the epitaxial layer. Another layer 28 (n+) overlying most of the p body region 27 serves as source for the device. A series of hexagonally shaped trenches 29 are provided in the epitaxial layer, opening toward the top and having a predetermined depth $d_{tr}$. The trenches 29 are typically lined with oxide and filled with conductive polycrystalline silicon, forming the gate for the MOSFET device. The trenches 29 define cell regions 31 that are also hexagonally shaped in horizontal cross-section.

A typical MOSFET device includes numerous individual MOSFET cells that are fabricated in parallel within a single chip (i.e., a section of a semiconductor wafer). Hence, the chip shown in FIG. 1 contains numerous hexagonal-shaped cells 31 (portions of five of these cells are illustrated). Cell configurations other than hexagonal configurations are commonly used, including square-shaped configurations. In a design like that shown in FIG. 1, the substrate region 23 acts as a common drain contact for all of the individual MOSFET cells 31. Although not illustrated, all the sources for the MOSFET cells 31 are typically shorted together via a metal source contact that is disposed on top of the n+ source regions 28. An insulating region, such as borophosphosilicate glass (not shown), is typically placed between the polycrystalline silicon in the trenches 29 and the metal source contact to prevent the gate regions from being shorted with the source regions. Consequently, to make gate contact, the polycrystalline silicon within the trenches 29 is typically extended into a termination region beyond the MOSFET cells 31, where a metal gate contact is provided on the polycrystalline silicon. Since the polycrystalline silicon gate regions are interconnected with one another via the trenches, this arrangement provides a single gate contact for all the gate regions of the device. As a result of this scheme, even though the chip contains a matrix of individual transistor cells 31, these cells 31 behave as a single large transistor.

It has been found that, as the sheet resistance over the p-body increases, the voltage drop across the p-body also increases, making the parasitic NPN transistor more susceptible to being incidentally turned on. For example, during avalanche breakdown, the parasitic transistor can be activated incidentally, which can seriously degrade the overall performance of the device and can even cause permanent damage to the device.

One approach by which the resistance of the body region (and hence the voltage drop across the body region) can be decreased in a trench MOSFET device is illustrated in FIG. 1. Within the cell region 31, a p+ portion of the body region 27 rises to the top surface of the epitaxial layer and forms an exposed pattern 33 in a horizontal cross section at the top surface of the cell region 31. This p+ central portion has a higher p-dopant concentration than the portion of the p-body region 27 that is adjacent the channel. This lowers the parasitic resistance of the P-body region 27, improving the robustness of the transistor cell. This is achieved because the voltage drop across the body regions 27 of the device is reduced, likewise reducing the parasitic resistance and hence reducing the likelihood of incidentally turning on the parasitic NPN transistors.

(It is also noted that, for the specific design illustrated in FIG. 1, the p+ central portion of the p body region 27 extends to a depth $d_{max}$ below the surface of the epitaxial layer that is greater than the trench depth $d_{tr}$ for the transistor cell so that breakdown voltage tends to occur away from the trench surface and in the bulk of the semiconductor material.)

A similar approach through which the resistance of the body region can be decreased in a trench MOSFET device is described in U.S. Pat. No. 6,031,265. FIG. 2 is taken from this patent and illustrates a portion of a trench MOSFET in which an N+ substrate 105 supports an N epi-layer 110. Each transistor cell of this device includes a trenched gate 125, an N+ source region 140, and a P-body region 130. An insulation layer 145 is also provided as is typical. Each transistor cell further includes a deep P+ region 138 formed in the P-body region. The deep P+ region 138 has a higher P-dopant concentration than the surrounding P-body, lowering the parasitic resistance of the P-body region 130 and improving the robustness of the transistor cell. A shallow P+ region 139 is further provided in the body region 130 to reduce the contact resistance at the metal contact 170.

SUMMARY OF THE INVENTION

Unfortunately, the p+ regions in the upper portions of the p-bodies (e.g., exposed p+ pattern 33 in FIG. 1 and regions 139 in FIG. 2 above) compete with the n+ source regions (e.g., regions 31 in FIG. 1 and regions 140 in FIG. 2) for contact area with the source contact (see, e.g., metal source contact 170 in FIG. 2). This dearth of contact area is further exacerbated in the event that the die size shrinks or the cell density increases.

Moreover, during the process of forming the upper p+ portions of the body regions, diffusion of p-type species into the n-type source regions commonly occurs, reducing the n-dopant concentrations within the n-type source regions. Reduced n-dopant concentrations make it difficult to achieve an effective ohmic contact with the subsequently deposited metal contact. As a result, the contact resistance is increased.

Both of these effects (i.e., the decrease in contact area and the increase in contact resistance) combine to increase the overall drain-source resistance, $Rd_{ds}$, of the device.

The present invention addresses these and other problems in the prior art. According to an embodiment of the invention, a trench MOSFET transistor device is provided, which comprises: (a) a silicon substrate of first conductivity type; (b) a silicon epitaxial layer of first conductivity type over the substrate, the epitaxial layer having a lower majority carrier concentration than the substrate; (c) a trench extending into the epitaxial layer from an upper surface of the epitaxial layer; (d) an insulating layer lining at least a portion of the trench; (e) a conductive region within the trench adjacent the insulating layer; (f) a body region of second conductivity type provided within an upper portion of the epitaxial layer and adjacent the trench; (g) a source region of first conductivity type provided within an upper portion of the body region and adjacent the trench; (h) an upper region of second conductivity type within an upper portion of the body region and adjacent the source region, the upper region having a higher majority carrier concentration than the body region; and (i) a source contact region disposed on the epitaxial layer upper surface, wherein the source contact region comprises a doped polycrystalline silicon contact region in electrical contact with the source region as well as an adjacent metal contact region in electrical contact with the source region and with the upper region.

The metal contact region preferably comprises aluminum. The doped polycrystalline silicon contact region is preferably an N-type polycrystalline silicon region, and more preferably an N-type polycrystalline silicon region having a doping concentration ranging from $5\times10^{19}$ to $1\times10^{20}$ cm$^{-3}$. The doped polycrystalline silicon contact region is also preferably substantially triangular in cross-section.

The trench MOSFET transistor device preferably further comprises an insulating region (e.g., borophosphosilicate glass region) that is disposed over the conductive region and extends above the epitaxial layer upper surface. In this case, the doped polycrystalline silicon contact region is preferably positioned laterally adjacent to the insulating region, preferably has a thickness that is greatest adjacent the insulating region, and preferably has an upper surface that slopes away from the insulating region.

In some embodiments, the trench MOSFET transistor device further comprises an additional region of second conductivity type, which has a higher majority carrier concentration than the body region and which is immediately below the upper region.

In various embodiments: (a) the trench MOSFET transistor device preferably comprises a plurality of transistor cells, for example, of square geometry or hexagonal geometry, (b) the insulating layer is preferably a silicon oxide layer, (c) the conductive region preferably comprises doped polycrystalline silicon, and/or (d) the first conductivity type is preferably N-type conductivity and the second conductivity type is preferably P-type conductivity (more preferably, the substrate is an N+ substrate, the epitaxial layer is an N epitaxial layer, the body region is a P region, the source region is an N+ region, and the upper region is a P+ region).

According to another embodiment of the invention, a trench MOSFET transistor device is provided, which comprises: (a) an N-type silicon substrate; (b) an N-type silicon epitaxial layer over the substrate, wherein the epitaxial layer has a lower majority carrier concentration than the substrate; (c) a trench extending into the epitaxial layer from an upper surface of the epitaxial layer; (d) a silicon oxide insulating layer lining at least a portion of the trench; (f) a doped polycrystalline silicon conductive region within the trench adjacent the insulating layer; (g) a P-type body region provided within an upper portion of the epitaxial layer and adjacent the trench; (h) an N-type source region provided within an upper portion of the body region and adjacent the trench; (i) a P-type upper region within an upper portion of the body region and adjacent the source region, the upper region having a higher majority carrier concentration than the body region; (j) a borophosphosilicate glass insulating region disposed over the conductive region, the insulating region extending above the epitaxial layer upper surface; and (k) a source contact region disposed on the epitaxial layer upper surface and laterally adjacent the insulating region, wherein the source contact region comprises a doped polycrystalline silicon contact region having N-type doping that is in electrical contact with the source region, as well as an adjacent metal contact region that is in electrical contact with both the source region and the upper region.

According to another embodiment of the invention, a method of forming a trench MOSFET transistor device is provided. The method comprises: (a) providing a silicon substrate of a first conductivity type; (b) depositing a silicon epitaxial layer of the first conductivity type over the substrate, the epitaxial layer having a lower majority carrier concentration than the substrate; (c) etching a trench extending into the epitaxial layer from an upper surface of the epitaxial layer; (d) forming an insulating layer that lines at least a portion of the trench; (e) forming a conductive region within the trench and adjacent the insulating layer; (f) forming a body region of a second conductivity type within an upper portion of the epitaxial layer and adjacent the trench; (g) forming a source region of the first conductivity type within an upper portion of the body region and adjacent the trench; (h) forming an upper region of second conductivity type within an upper portion of the body region and adjacent the source region, the upper region having a higher majority carrier concentration than the body region; and (i) forming a source contact region on the epitaxial layer upper surface, wherein the source contact region comprises both a doped polycrystalline silicon contact region in electrical contact with the source region and an adjacent metal contact region in electrical contact with the source region and with the upper region.

Preferably, the method further comprises forming an insulating region (e.g., borophosphosilicate glass region) that is disposed over the conductive region and extends above the epitaxial layer upper surface. In this case, the source contact region is preferably formed by a process comprising: (a) providing a layer of doped polycrystalline silicon over the insulating region and the epitaxial layer upper surface; (b) etching the layer of doped polycrystalline silicon (e.g., by reactive ion etching) until a portion of the epitaxial layer upper surface is exposed and a portion of the doped polycrystalline silicon remains adjacent the insulating region, and (c) depositing a metal layer over the insulating region, the epitaxial layer upper surface, and the remaining portion of the doped polycrystalline silicon adjacent the insulating region.

One advantage of the present invention is that a trench MOSFET device is provided in which the contact resistance of the device is decreased.

Another advantage of the present invention is that a trench MOSFET device is provided in which the effective source contact area of the device is increased.

Another advantage of the present invention is that a trench MOSFET device is provided having improved drain-source resistance.

The above and other embodiments and advantages of the present invention will become immediately apparent to those of ordinary skill in the art upon review of the Detailed Description and Claims to follow.

DETAILED DESCRIPTION OF PREFERRED EMBODIMENTS OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 1:
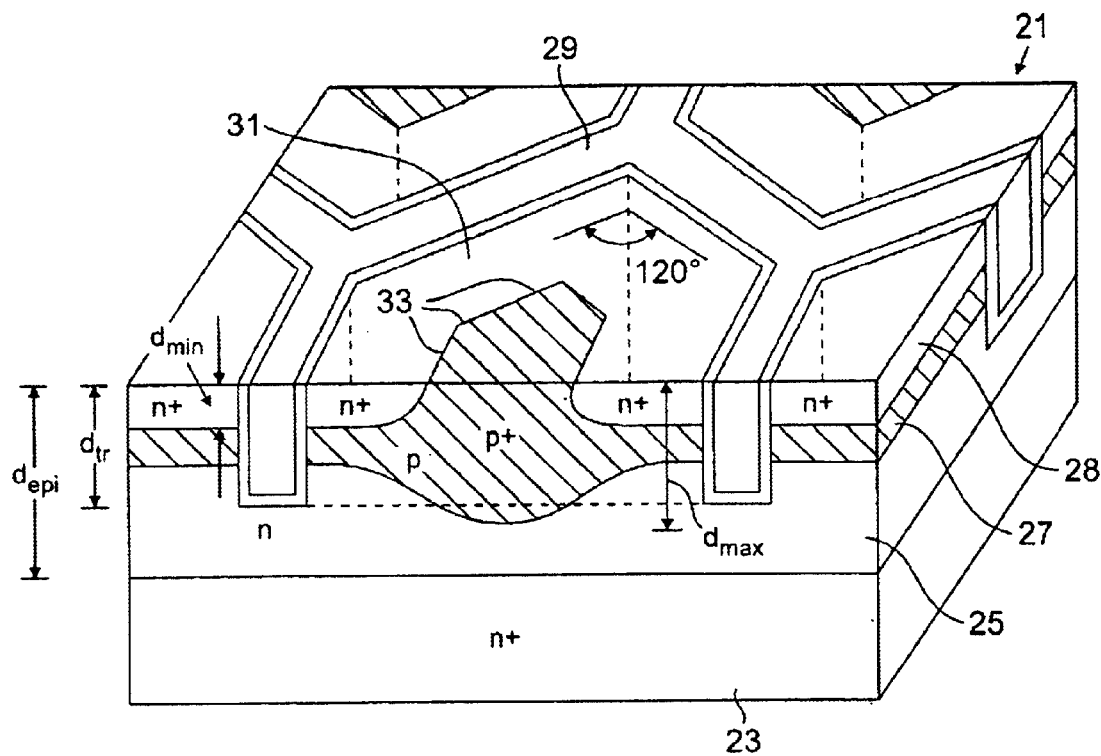
FIG. 1 is a schematic partial cross-sectional view of a trench MOSFET device in the prior art.
Figure 2:
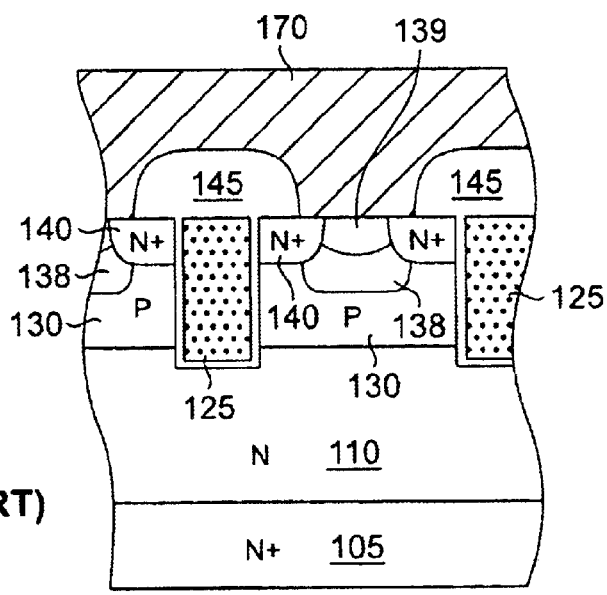
FIG. 2 is a schematic partial cross-sectional view of a trench MOSFET device in the prior art.
Figure 3A:
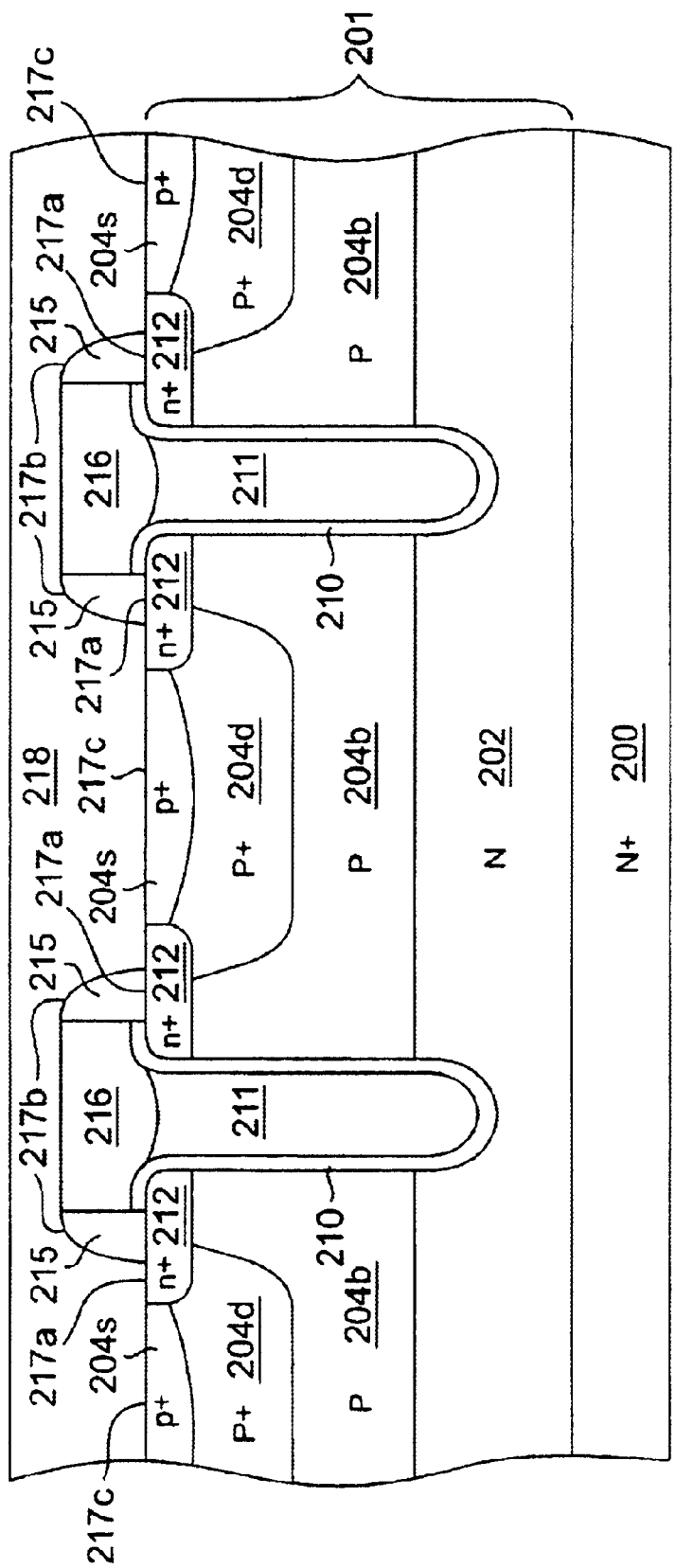
FIG. 3A is a schematic partial cross-sectional view of a trench MOSFET device, in accordance with an embodiment of the present invention.

FIG. 3A illustrates a trench MOSFET in accordance with an embodiment of the present invention. In the trench MOSFET shown, an epitaxial layer 201 is provided on an N+ substrate 200.

The N+ substrate 200 in this specific example is a silicon substrate having a thickness ranging, for example, from 10 to 25 mils and a net doping concentration ranging, for example, from $1 \times 10^{19}$ to $1 \times 10^{20}$ cm$^{-3}$.

An N region 202 is found in the lower portion of the epitaxial layer 201, which is a silicon layer in this example. In this example, N region 202 has a thickness ranging, for example, from 2 to 8 microns and a net doping concentration ranging, for example, from $1 \times 10^{15}$ to $5 \times 10^{16}$ cm$^{-3}$.

P body regions 204b are found in the middle portion of epitaxial layer 201. In the example shown, these P-body regions 204b extend, for example, to a depth of 1 to 2 microns from the upper surface of the epitaxial layer 201 and have a net doping concentration ranging, for example, from $1 \times 10^{15}$ to $5 \times 10^{16}$ cm$^{-3}$.

Shallow P+ regions 204s are found in an upper portion of the epitaxial layer 201. In the example shown, these shallow P+ regions 204s range, for example, from 0.2 to 0.4 microns in depth from the upper surface of the epitaxial layer and have a net doping concentration ranging, for example, from $1 \times 10^{15}$ to $1 \times 10^{17}$ cm$^{-3}$. Deep P+ regions 204d are also provided below the shallow P+ regions 204s. In the example shown, these deep P+ regions 204d extend, for example, to a depth of 0.4 to 1 micron from the upper surface of the epitaxial layer 201 and have a net doping concentration ranging, for example, from $1 \times 10^{14}$ to $1 \times 10^{16}$ cm$^{-3}$. Although not wishing to be bound by theory, and as previously discussed in U.S. Pat. No. 6,031,265, it is believed that the deep P+ regions 204d reduce the parasitic resistance of the cell. The shallow P+ regions 204s further reduce the contact resistance at the metal contact portion 218.

Trenches formed within the epitaxial layer 201 are lined with an insulator 210, typically an oxide insulator such as silicon oxide, and are filled with conductor 211, typically doped polycrystalline silicon, providing the gate electrode function of the device. The trenches extend, for example, to a depth of 1.5 to 3 microns from the upper surface of the epitaxial layer 201 and are, for example, 0.4 to 0.8 microns in width. Where silicon oxide (typically silicon dioxide) is used as the insulator 210, it can be for example, 500 to 700 Angstroms thick. Where polycrystalline silicon is used as the conductor 211, it can have a resistivity of, for example, 1 to 15 ohm/sq. The regions between the trenches are frequently referred to as "mesas" or "trench mesas", based on their shapes. These regions range, for example, from 1 to 5 microns in width.

The trench MOSFET device of FIG. 3A also contains N+ source regions 212, which extend, for example, to a depth of 0.3 to 0.5 microns from the epitaxial layer 201 surface and have net doping concentrations ranging, for example, from $1 \times 10^{19}$ to $1 \times 10^{20}$ cm$^{-3}$.

The source contact in the device of FIG. 3A contains both a metal contact portion 218 and doped polycrystalline silicon contact portions 215. Insulating regions, such as BPSG (borophosphosilicate glass) regions 216, prevent the doped polycrystalline silicon regions 211 associated with the gate electrodes from being shorted to the N+ source regions 212 through the source contact.

The metal contact portion 218 of the source contact is in electrical contact with both the source regions 212 and with the shallow P+ regions 204s. Aluminum and copper are preferred materials for the metal contact portion 218.

The doped polycrystalline silicon contact portions 215 of the source contact are in electrical contact with the source regions 212. N-type dopants, such as arsenic, are preferred. Preferred doping concentrations for the doped polycrystalline silicon contact portions 215 range from 1 to 10 ohm/sq.

Although doped polycrystalline silicon has a higher bulk resistivity than metal, the overall resistance associated with the gate contact of FIG. 3A is nonetheless reduced relative to the case where the polycrystalline silicon contact portions 215 are absent. Without wishing to be bound by theory of operation, this is believed to be the case for the following reasons:

Due to the fact that the polycrystalline silicon contact portions 215 and the source regions 212 are formed of the same material (i.e., silicon), the contact resistance between these regions is very low, much lower than that associated with a metal-silicon interface. This is particularly true where the doping concentration of the source regions 212 is low at the metal-silicon interface (e.g., less than $4 \times 10^{19}$ cm$^{-3}$), a situation that is commonly encountered in a design like that shown in FIG. 3A due to diffusion during processing. Such low doping concentrations prevent the formation of an effective ohmic contact between the metal and the silicon. By providing the relatively highly doped polycrystalline silicon contact portions 215, however, an effective ohmic contact is achieved between the metal contact portion 218 and the polycrystalline silicon contact portions 215. At the same time, an effective contact exists between the polycrystalline silicon contact portions 215 and the sources 212 for the reasons just mentioned.

The contact design of FIG. 3A is also advantageous because the interfacial area between metal and silicon is increased, and hence the contact resistance is decreased. For example, referring to FIG. 3A, metal and silicon (either polycrystalline silicon or single crystal silicon) form interfaces as indicated by numerals 217b and 217c. In the absence of the polycrystalline silicon contact portions 215, the metal and silicon would form interfaces as indicated by numerals 217a and 217c. Interfaces 217b are larger than interfaces 217a. (This can be understood by realizing that the polycrystalline silicon contact portions 215 are substantially triangular in cross section. Hence, interface 217a can be thought of as the leg of a right triangle, and interface 217b can be thought of as the hypotenuse of the same right triangle. However, since interface 217b is bowed, the effect is even more pronounced.) As a result, the interfacial area between metal and silicon is increased from that which would be observed in the absence of polycrystalline silicon contact portions 215.

To complete the device, a separate metal gate contact (not shown) is typically connected to the gate runner portion of the polycrystalline silicon 211 located outside of the region of the trench MOSFET cells. A metal drain contact (not shown) is also typically provided adjacent the N+ substrate 200.

Figure 3B:
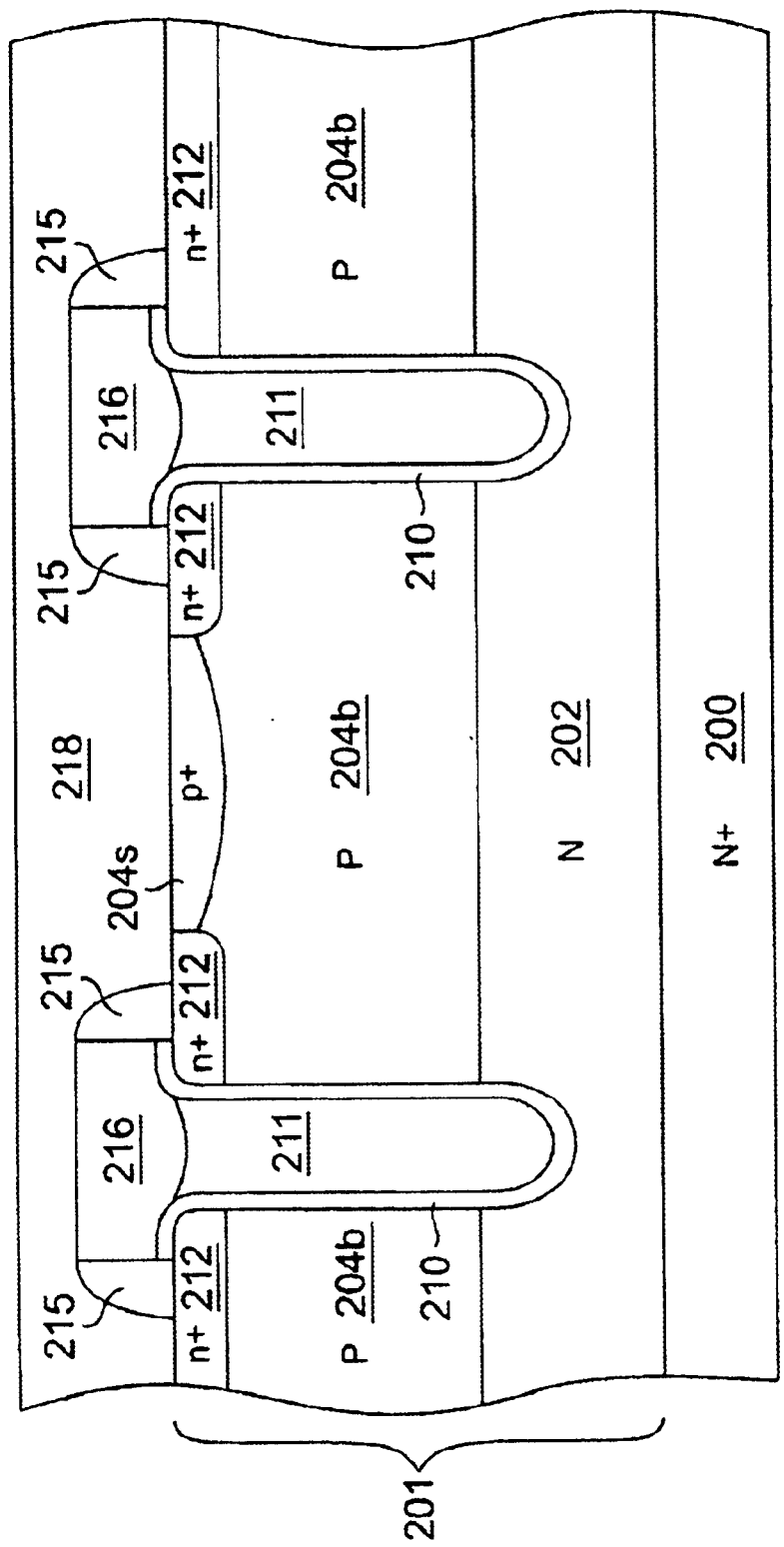
FIG. 3B is a schematic partial cross-sectional view of a trench MOSFET device, in accordance with another embodiment of the present invention.

Another embodiment of the present invention is illustrated in FIG. 3B. FIG. 3B is essentially the same as FIG. 3A, except that the deep P+ regions 204d are eliminated.

Figure 4A:
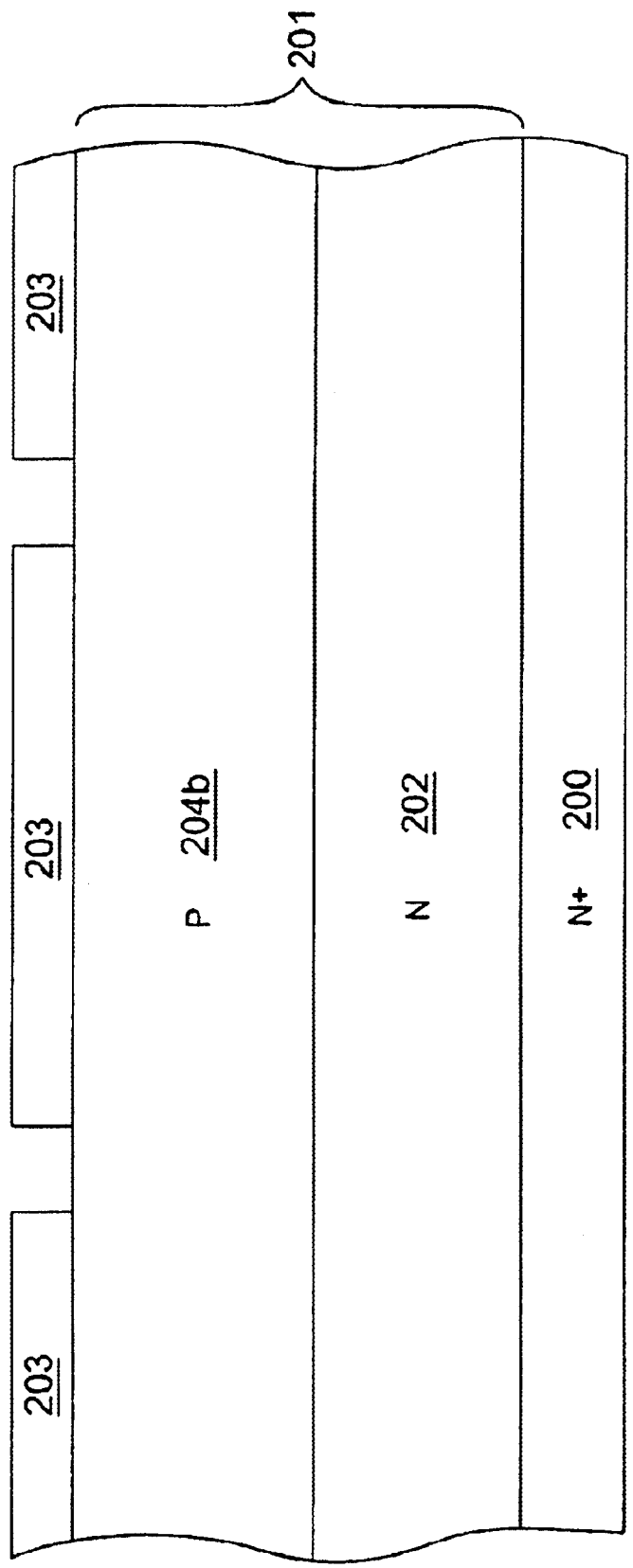
FIGS. 4A through 4D are schematic partial cross-sectional views illustrating a method of making a trench MOSFET device like that of FIG. 3A, in accordance with an embodiment of the present invention.

A method will now be described for manufacturing a trench MOSFET like that shown in FIG. 3A, in accordance with an embodiment of the present invention. Turning now to FIG. 4A, an epitaxial layer 201 (N doped) is grown on an N+ doped substrate 200. The N+ doped substrate 200, for example, can be 10 to 25 mils thick and have a net n-type doping concentration of from $1 \times 10^{19}$ to $1 \times 10^{20}$ cm$^{-3}$. The epitaxial layer 201 can have, for example, a net N-type doping concentration of $1 \times 10^{15}$ to $5 \times 10^{16}$ cm$^{-3}$.

A P body region 204b is then formed in the epitaxial layer 201 by implantation and diffusion. For example, the epitaxial layer 201 may be implanted with boron at 20 to 50 keV with a dosage of $5 \times 10^{13}$ to $1 \times 10^{14}$, followed by diffusion at 1100 to 1200 degrees C. for 30 to 120 minutes. This produces a P body region 204b, which extends, for example, to a depth of 1 to 2 microns from the upper surface of the epitaxial layer 201 and has a net p-type doping concentration of $1 \times 10^{15}$ to $5 \times 10^{16}$ cm$^{-3}$. After this step, a portion of the epitaxial layer 201 remains n-type (i.e., N region 202), which is, for example, 2 to 8 microns thick. N region 202 generally maintains the n-type doping concentration that is noted above for epitaxial layer 201. A patterned trench mask layer 203 is then formed. The resulting structure is shown in FIG. 4A.

Trenches are then etched through apertures in the patterned trench mask 203, for example, by a dry anisotropic etching step. Trench depths in this example are about 1.5 to 3 microns. Discrete P body regions 204b are established as a result of this trench-forming step. A sacrificial oxide layer is typically grown within the trench and removed as is known in the art. An oxide layer 210, which is preferably 500 to 700 Angstroms thick, is then grown over the trench bottom, for example, by wet or dry oxidation at 900 to 1100° C. for 30 to 60 minutes. Portions of this oxide layer 210 ultimately form the gate oxide regions for the finished device.

Figure 4B:
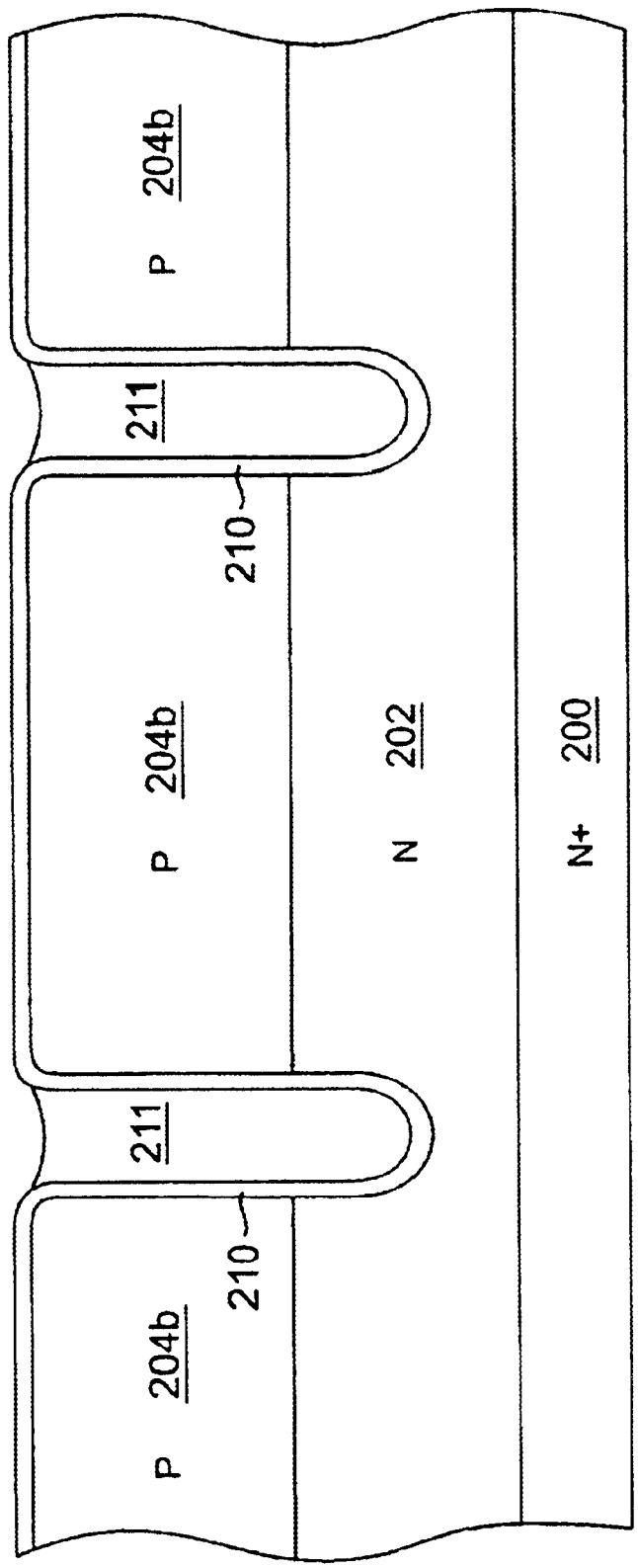

The surface of the structure is then covered, and the trenches are filled, with a polycrystalline silicon layer, preferably using CVD. The polycrystalline silicon is typically doped N-type to reduce its resistivity. N-type doping can be carried out, for example, during CVD with phosphorous chloride or by implantation with arsenic or phosphorous. The polycrystalline silicon layer is then etched, for example, by reactive ion etching. The polycrystalline silicon layer within the trench segments is commonly slightly overetched due to etching uniformity concerns, and the thus-formed polycrystalline silicon gate regions 211 typically have top surfaces that are 0.1 to 0.2 microns below the adjacent surface of the epitaxial layer 204b. The resulting structure is shown in FIG. 4B.

Figure 4C:
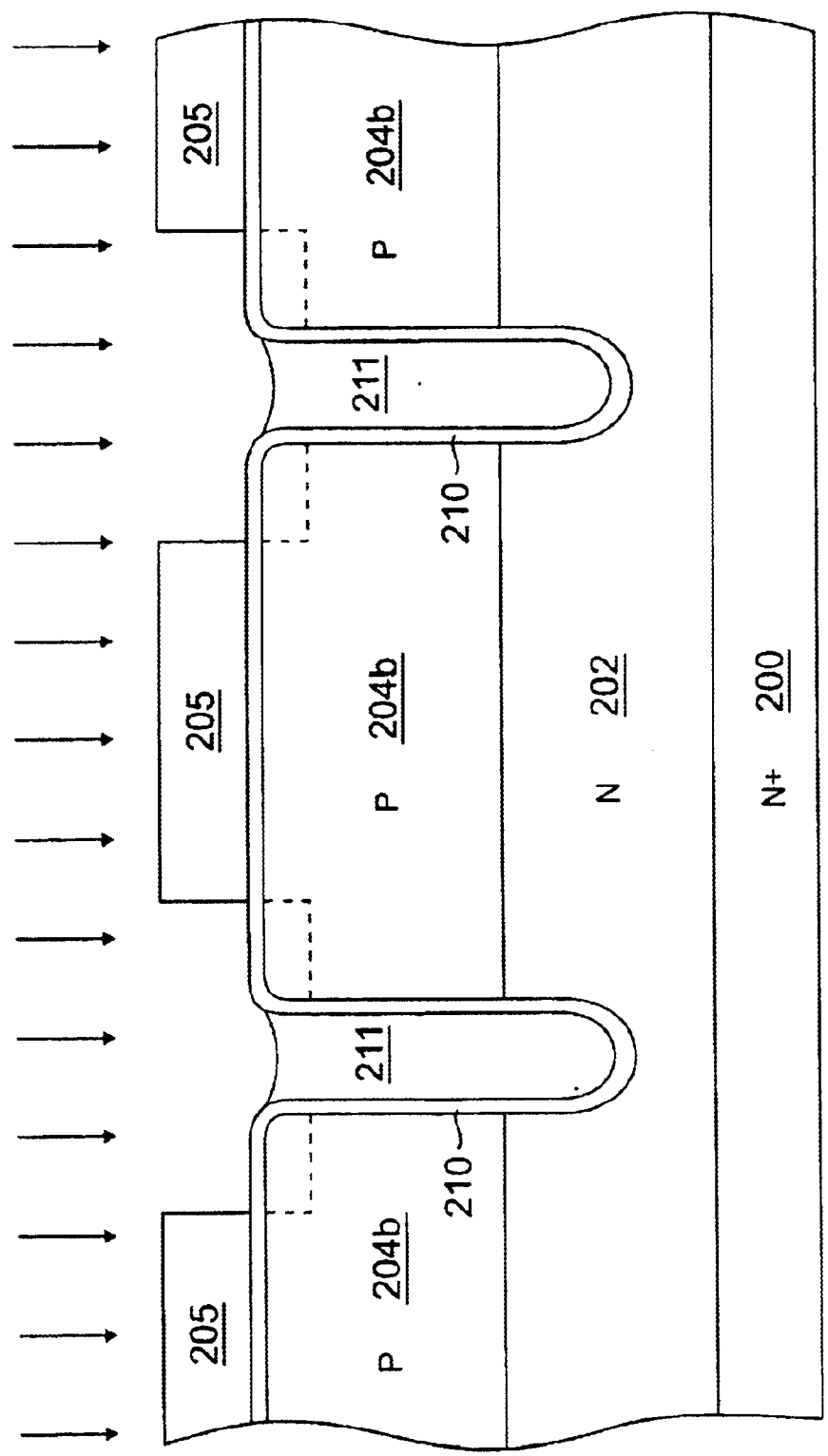

A patterned source mask 205 is provided over the structure. N+ source regions 212 are then formed in upper portions of the epitaxial layer by implanting an N-dopant, such as arsenic or phosphorous, through apertures in the source mask. Implantation is preferably conducted through an implant oxide to avoid implant-channeling effects, implant damage, and heavy metal contamination during formation of the source regions. The structure can be implanted, for example, with phosphorous at 100 to 130 keV with a dosage of $5 \times 10^{15}$ to $8 \times 10^{15}$. The resulting structure is shown in FIG. 4C, with the implanted regions being designated by dashed lines.

The source mask is then stripped. An insulating layer, preferably a BPSG (borophosphosilicate glass) layer is then deposited over the entire structure, for example, by PECVD. The BPSG is then subjected to a reflow step, for example, at 900 to 1000 C. for 20 to 60 minutes. This reflow step also acts to diffuse the n-type dopants implanted earlier, producing N+ source regions 212, which extend to a depth of 0.3 to 0.5 microns from the epitaxial layer surface and have net doping concentrations ranging, for example, from $1 \times 10^{19}$ to $1 \times 10^{20}$ cm$^{-3}$.

After providing a patterned masking layer (not shown), the structure is then etched, typically by reactive ion etching, removing BPSG and oxide portions that are not protected by the masking layer. This step forms distinct BPSG regions 216 and distinct oxide regions 210.

The resist layer is then stripped, and a layer of doped polycrystalline silicon is provided over the structure, preferably using CVD. As above, the polycrystalline silicon is typically doped N-type to reduce its resistivity. Preferred resistivities range from 1 to 15 ohm/sq. The polycrystalline silicon layer is then blank etched (i.e., etched without a mask), for example, by reactive ion etching. Etching is conducted until portions of the upper surface of the epitaxial layer are exposed, with distinct polycrystalline silicon regions 215 remaining adjacent the sidewalls of the BPSG regions.

Boron is then implanted through the apertures found between the polycrystalline silicon regions 215 in both a low energy implant step and a high-energy implant step. For example, the structure can be subjected to a high energy implantation with boron at 100 to 200 keV with a dosage of $2 \times 10^{13}$ to $2 \times 10^{14}$, followed by a low energy implantation with boron at 20 to 50 keV with a dosage of $5 \times 10^{14}$ to $1 \times 10^{15}$. Alternatively, the low energy implantation can precede the high energy one.

Figure 4D:
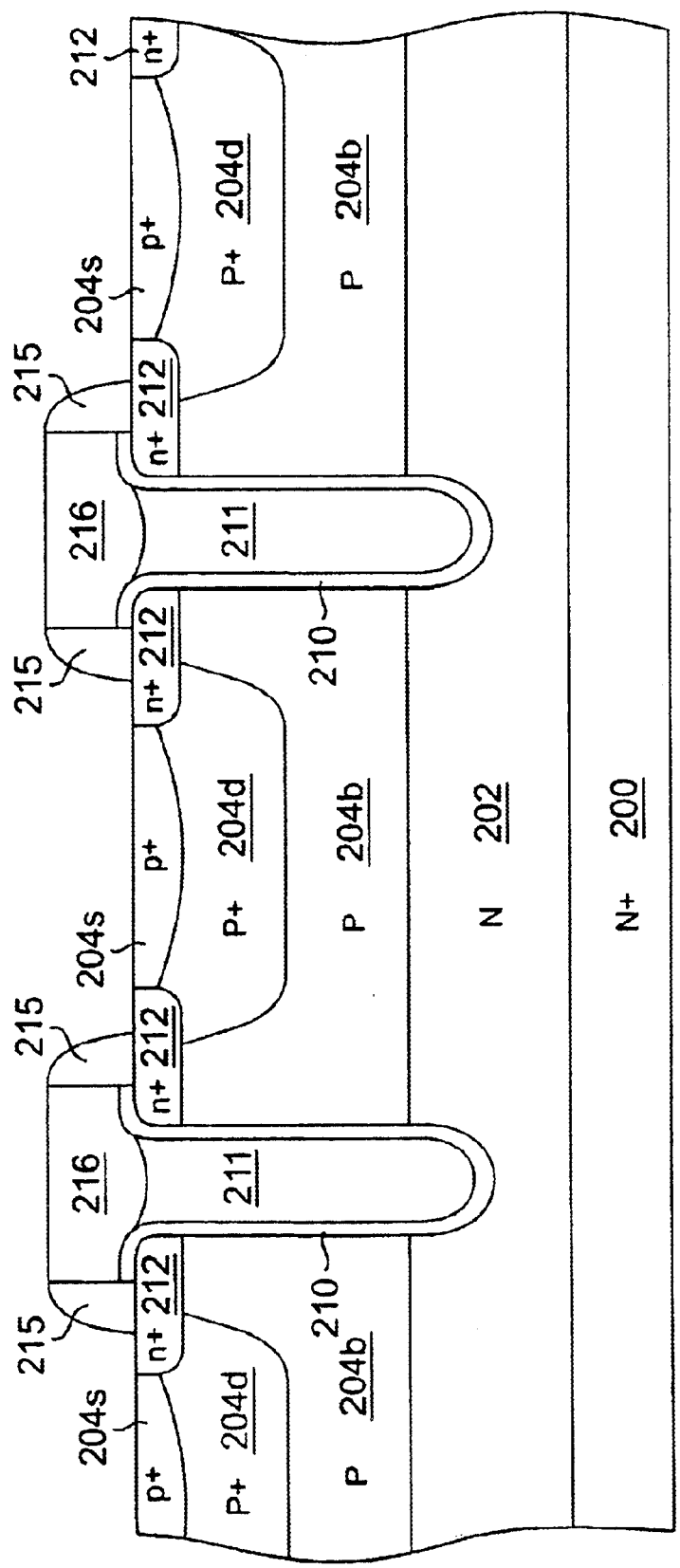

The structure is then subjected to a rapid thermal annealing (RTA) step, for example, 900 to 100 degrees C. for 1 to 2 minutes. This step diffuses the high- and low-energy-implanted boron to their final distributions, forming deep P+ regions 204d and shallow P+ regions 204s, respectively. As noted above, the deep P+ regions 204d typically extend, for example, from 0.4 to 1 microns in depth from the upper surface of the epitaxial layer and have a net doping concentration ranging, for example, from $1 \times 10^{14}$ to $1 \times 10^{16}$ cm$^{-3}$. At the same time, the shallow P+ regions 204s typically extend, for example, from 0.2 to 0.4 microns in depth from the upper surface of the epitaxial layer and have a net doping concentration ranging, for example, from $1 \times 10^{15}$ to $1 \times 10^{17}$. The resulting structure is illustrated in FIG. 4D.

Figure 5A:
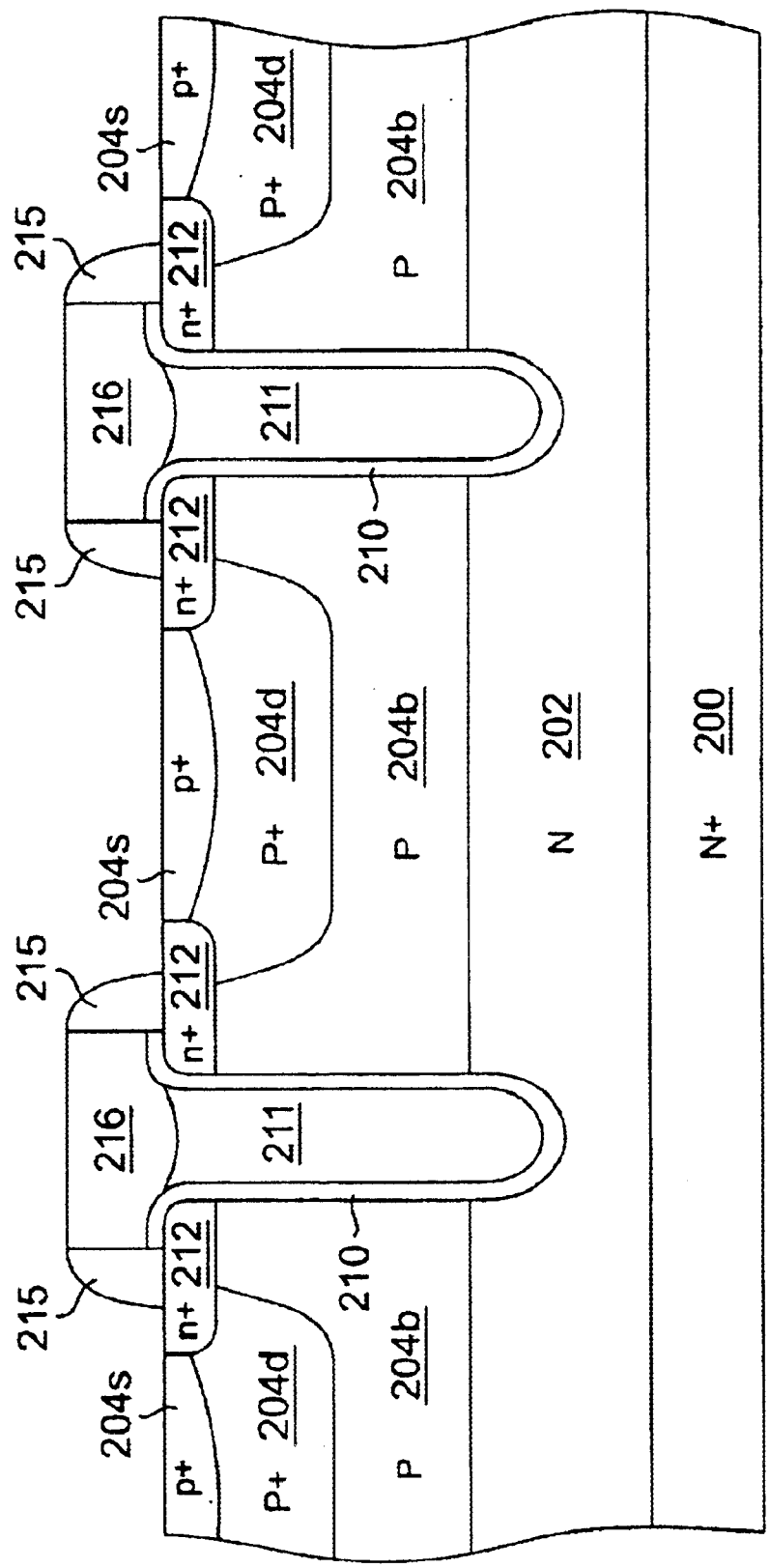
FIGS. 5A and 5B are schematic partial cross-sectional views illustrating a method for varying the width of the doped polycrystalline silicon contact portions within a trench MOSFET device, in accordance with an embodiment of the present invention.
Figure 5B:
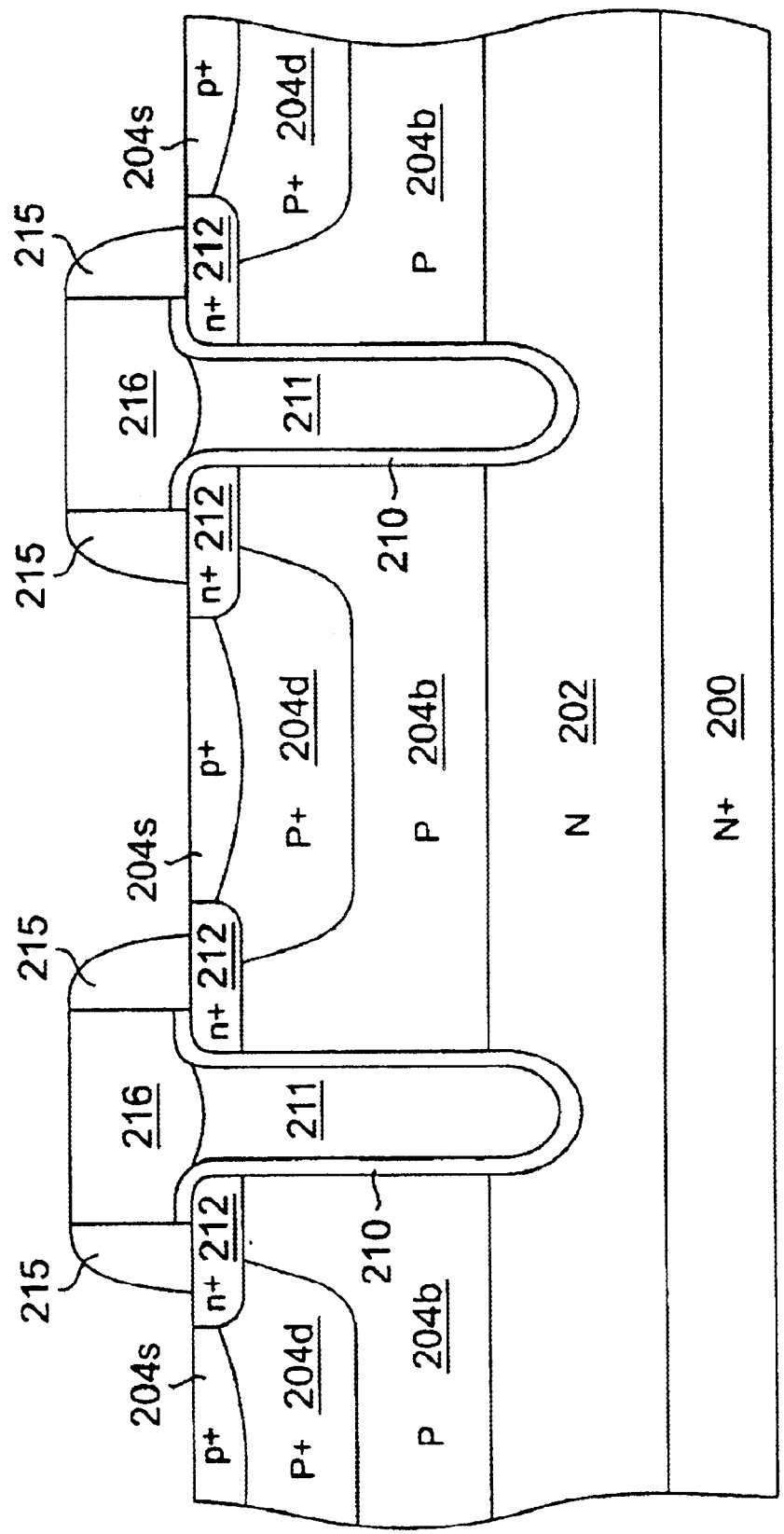

As seen by comparing FIGS. 5A with 5B, the width of the polycrystalline silicon regions 215 can be increased by increasing the height of the BPSG regions 216. This technique is effective, because the shapes of the polycrystalline silicon regions 215 are relatively similar (from a geometric standpoint), even though the heights of the BPSG regions 216 may differ. BPSG region 216 heights of 0.3 to 0.6 micron and polycrystalline silicon region 215 widths of 0.1 to 0.3 micron are typical.

At this point, a metal contact layer is normally deposited, resulting in a structure like that illustrated in FIG. 3A. The metal contact layer provides metal contact portion 218 as illustrated. Gate and drain contacts (not shown) are also typically provided.

Although various embodiments are specifically illustrated and described herein, it will be appreciated that modifications and variations of the present invention are covered by the above teachings and are within the purview of the appended claims without departing from the spirit and intended scope of the invention. As one specific example, the method of the present invention may be used to form a structure in which the conductivities of the various semiconductor regions are reversed from those described herein.

What is claimed is:

1. A trench MOSFET transistor device comprising:

a silicon substrate of a first conductivity type;

a silicon epitaxial layer of said first conductivity type over said substrate, said epitaxial layer having a lower majority carrier concentration than said substrate;

a trench extending into said epitaxial layer from an upper surface of said epitaxial layer; an insulating layer lining at least a portion of said trench;

a conductive region within said trench adjacent said insulating layer;

a body region of a second conductivity type provided within an upper portion of said epitaxial layer and adjacent said trench;

a source region of said first conductivity type provided within an upper portion of said body region and adjacent said trench;

an upper region of second conductivity type within an upper portion of said body region and laterally adjacent said source region, wherein said upper region does not extend to said trench, and wherein said upper region has a higher majority carrier concentration than said body region; and a source contact region disposed on said epitaxial layer upper surface, said source contact region comprising (a) a doped polycrystalline silicon contact region in electrical contact with said source region and (b) a metal contact region adjacent said doped polycrystalline silicon contact region and in electrical contact with said source region and with said upper region, wherein said source region does not contain dopant diffused from said doped polycrystalline silicon contact region.

2. The trench MOSFET transistor device of claim 1, wherein said metal contact region comprises aluminum.

3. The trench MOSFET transistor device of claim 1, wherein said doped polycrystalline silicon contact region is an N-type polycrystalline silicon region.

4. The trench MOSFET transistor device of claim 3, wherein said doped polycrystalline silicon contact region has a doping concentration ranging from $5\times10^{19}$ to $1\times10^{20}$ cm$^{-3}$.

5. The trench MOSFET transistor device of claim 1, wherein said doped polycrystalline silicon contact region is substantially triangular in cross-section.

6. The trench MOSFET transistor device of claim 1, further comprising an insulating region disposed over said conductive region, said insulating region extending above said epitaxial layer upper surface.

7. The trench MOSFET transistor device of claim 6, wherein insulating region is a borophosphosilicate glass region.

8. The trench MOSFET transistor device of claim 6, wherein said doped polycrystalline silicon contact region is positioned laterally adjacent to said insulating region.

9. The trench MOSFET transistor device of claim 8, wherein a thickness of said doped polycrystalline silicon contact region is greatest adjacent said insulating region, and wherein an upper surface of said doped polycrystalline silicon contact region slopes away from said insulating region.

10. The trench MOSFET transistor device of claim 1, further comprising an additional region of second conductivity type immediately below said upper region, said additional region having a higher majority carrier concentration than said body region.

11. The trench MOSFET transistor device of claim 1, wherein said device comprises a plurality of transistor cells of square geometry or hexagonal geometry.

12. The trench MOSFET transistor device of claim 1, wherein said insulating layer is a silicon oxide layer.

13. The trench MOSFET transistor device of claim 1, wherein the conductive region comprises doped polycrystalline silicon.

14. The trench MOSFET transistor device of claim 1, wherein said first conductivity type is N-type conductivity and said second conductivity type is P-type conductivity.

15. The trench MOSFET transistor device of claim 1, wherein said substrate is an N+ substrate, said epitaxial layer is an N epitaxial layer, said body region is a P region, said source region is an N+ region, and said upper region is a P+ region.

16. A trench MOSFET transistor device comprising:

an N-type silicon substrate;

an N-type silicon epitaxial layer over said substrate, said epitaxial layer having a lower majority carrier concentration than said substrate;

a trench extending into said epitaxial layer from an upper surface of said epitaxial layer; a silicon oxide insulating layer lining at least a portion of said trench;

a doped polycrystalline silicon conductive region within said trench adjacent said insulating layer;

a P-type body region provided within an upper portion of said epitaxial layer and adjacent said trench;

an N-type source region provided within an upper portion of said body region and adjacent said trench;

a P-type upper region within an upper portion of said body region and laterally adjacent said source region, wherein said upper region does not extend to said trench, and wherein said upper region has a higher majority carrier concentration than said body region; a borophosphosilicate glass insulating region disposed over said conductive region, said insulating region extending above said epitaxial layer upper surface; and a source contact region disposed on said epitaxial layer upper surface and laterally adjacent said insulating region, said source contact region comprising (a) a doped polycrystalline silicon contact region having N-type doping and (b) a metal contact region adjacent said doped polycrystalline silicon contact region and in electrical contact with said source region and with said upper region, wherein said source region does not contain dopant diffused from said doped polycrystalline silicon contact region.

* * * * *